(12) United States Patent
Boivin et al.

(10) Patent No.: US 11,152,430 B2
(45) Date of Patent: Oct. 19, 2021

(54) INTEGRATED CIRCUIT INCLUDING BIPOLAR TRANSISTORS

(71) Applicants: STMicroelectronics (Rousset) SAS, Rousset (FR); STMicroelectronics (Crolles 2) SAS, Crolles (FR)

(72) Inventors: Philippe Boivin, Venelles (FR); Jean Jacques Fagot, Rousset (FR); Emmanuel Petitprez, Grenoble (FR); Emeline Souchier, Saint-Ismier (FR); Olivier Weber, Grenoble (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 104 days.

(21) Appl. No.: 16/375,571

(22) Filed: Apr. 4, 2019

(65) Prior Publication Data

US 2019/0312088 A1    Oct. 10, 2019

(30) Foreign Application Priority Data

Apr. 6, 2018   (FR) ...................................... 1853043

(51) Int. Cl.
   *H01L 29/73*    (2006.01)
   *H01L 27/24*    (2006.01)
   *H01L 45/00*    (2006.01)

(52) U.S. Cl.
   CPC .......... *H01L 27/2445* (2013.01); *H01L 45/06* (2013.01); *H01L 45/1233* (2013.01)

(58) Field of Classification Search
   None
   See application file for complete search history.

(56) References Cited

U.S. PATENT DOCUMENTS

| 7,847,374 B1* | 12/2010 | Wang .................. H01L 27/1026 257/560 |
| 2006/0049392 A1* | 3/2006 | Pellizzer ............... H01L 27/101 257/5 |
| 2012/0099363 A1 | 4/2012 | Inaba |

FOREIGN PATENT DOCUMENTS

JP     2005-26392 A     1/2005

* cited by examiner

*Primary Examiner* — Joseph C. Nicely
*Assistant Examiner* — Lamont B Koo
(74) *Attorney, Agent, or Firm* — Seed Intellectual Property Law Group LLP

(57) ABSTRACT

The disclosure relates to integrated circuits and methods including one or more rows of transistors. In an embodiment, an integrated circuit includes a row of bipolar transistors including a plurality of first conduction regions, a second conduction region, and a common base between the first conduction regions and the second conduction region. An insulating trench is in contact with each bipolar transistor of the row of bipolar transistors. A conductive layer is on the insulating trench and the common base between the first conduction regions. A spacer layer is between the conductive layer and the first conduction regions.

20 Claims, 5 Drawing Sheets

INTEGRATED CIRCUIT INCLUDING BIPOLAR TRANSISTORS

BACKGROUND

Technical Field

The present disclosure concerns integrated circuits and more particularly the connections of bipolar transistors. The present disclosure more particularly applies to the forming of an array of memory cells.

Description of the Related Art

Memories are generally in the form of arrays, comprising word lines, and columns, or bit lines. A memory cell containing binary information is located at each crossing of a word line and of a bit line.

In a phase-change memory, each memory cell comprises a layer of a phase-change material having its lower portion in contact with a resistive element. Phase change materials are materials which may switch from a crystalline phase to an amorphous phase, and conversely. Such a switching is caused by an increase in the temperature of the resistive element through which an electric current is conducted. The electric resistance difference between the amorphous phase of the material and the crystal phase thereof is used to define two memory states, for example, 0 and 1.

In the example of a phase-change memory, the memory cells are for example controlled by bipolar transistors which conduct or not the current used to heat the resistive elements. The memory cells belonging to a same bit line are connected by a conductor covering the phase-change material and the memory cells belonging to a same word line are connected together by the bases of the bipolar transistors, for example, by a base common to all the transistors of a same word line.

The binary information of a memory cell of a phase change memory is for example accessed by measuring the resistance between the bit line and the word line of the memory cell.

BRIEF SUMMARY

In an embodiment, the present disclosure provides an integrated circuit including a row of bipolar transistors. The row of bipolar transistors includes a plurality of first conduction regions, a second conduction region, and a common base between the first conduction regions and the second region. An insulating trench is in contact with each of the bipolar transistors of the row of transistors. A conductive layer is on the insulating trench and the common base between the first conduction regions. A spacer layer is between the conductive layer and the first conduction regions.

According to an embodiment, the conductive layer includes polysilicon.

According to an embodiment, the conductive layer is separated from the common base by a metal layer.

According to an embodiment, the conductive material includes a metal.

According to an embodiment, each transistor controls a memory cell of a phase-change memory.

According to an embodiment, the conductive layer is connected by a single via to an interconnection network.

According to an embodiment, the plurality of first conduction regions contacts the base, and the base contacts the second conduction region.

According to an embodiment, the each of transistors of the row includes the second conduction region.

According to an embodiment, at least portions of the conductive layer are covered with insulating strips and with polysilicon strips.

In another embodiment, the present disclosure provides a method that includes: forming a row of bipolar transistors having a common base, the common base being located between a plurality of first conduction regions and a second conduction region, the first conduction regions being separated from one another by insulator walls, an insulating trench being in contact with the row of transistors; forming a cavity in the insulating trench and the insulator walls, side surfaces of the first conduction regions being exposed in the cavity; forming a spacer layer in the cavity, the spacer layer covering the exposed side surfaces of the first conduction regions and a side surface of the insulating trench in the cavity; and filling the cavity with a conductive material.

According to an embodiment, forming the cavity includes forming an etch mask, the etch mask including strips extending in a direction of the row of transistors and extending partly over the first conduction regions, partly over the walls of insulator, and partly over the insulating trench.

According to an embodiment, the conductive material is polysilicon.

According to an embodiment, a metal layer is deposited in the cavity and on the spacer layer prior to the filling the cavity with the conductive material.

According to an embodiment, the conductive material includes a metal.

According to an embodiment, the metal layer is titanium.

The foregoing and other features and advantages will be discussed in detail in the following non-limiting description of specific embodiments in connection with the accompanying drawings.

DETAILED DESCRIPTION

Figure 1:
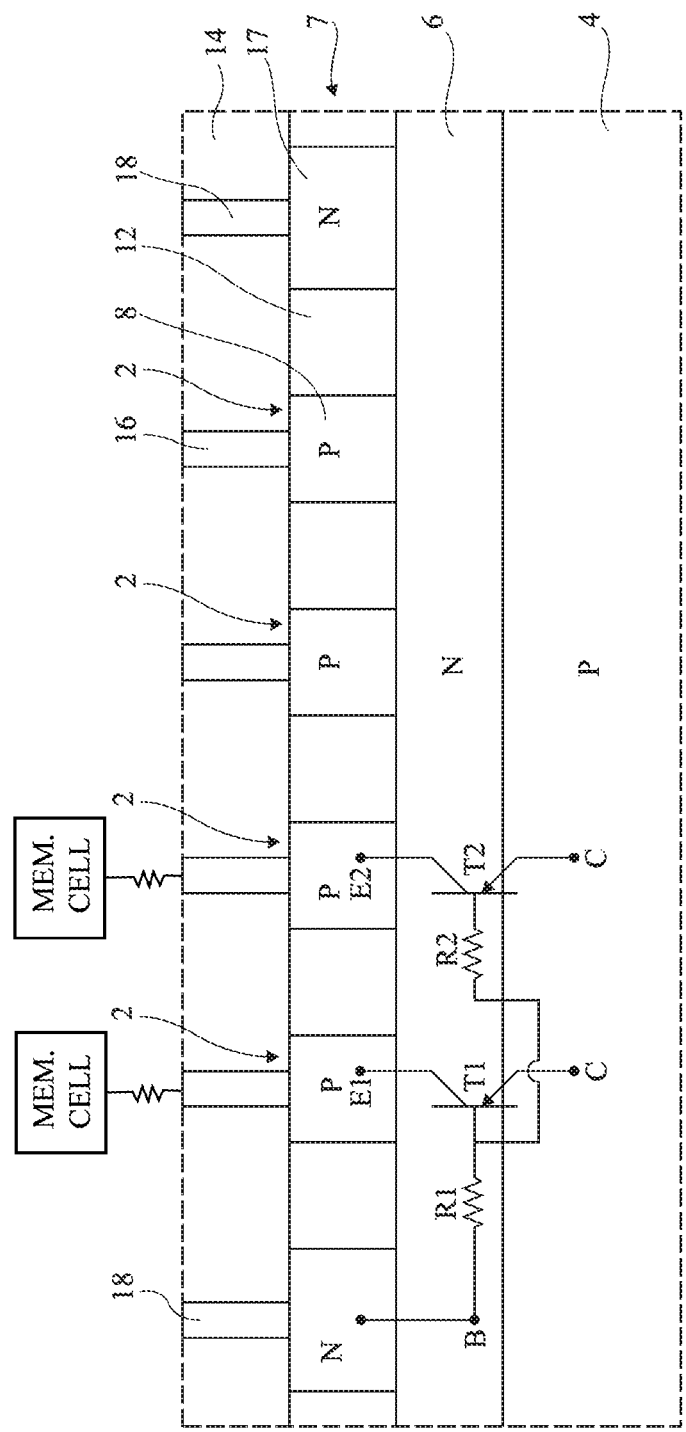
FIG. 1 is a simplified cross-section view of bipolar transistors having a common base.

The same elements have been designated with the same reference numerals in the various drawings and, further, the various drawings are not to scale. For clarity, only those steps and elements which are useful to the understanding of the described embodiments have been shown and are detailed. In particular, only the transistors have been shown. The memory cells and the interconnection networks to which they may be connected are not detailed.

In the following description, when reference is made to terms qualifying the relative position, such as term "top", "bottom", "upper", or "lower", etc., reference is made to the orientation of the concerned elements in the drawings. Unless otherwise specified, the terms "approximately" and "substantially" are used herein to designate a tolerance of plus or minus 10%, preferably of plus or minus 5%, of the value in question.

FIG. 1 is a simplified cross-section view of an integrated circuit portion comprising four bipolar transistors 2, for example of PNP type. The considered bipolar transistors are vertical bipolar transistors, that is, bipolar transistors having their different portions, the base and the regions forming the two conduction terminals, that is, the emitter and the collector, formed one above the others. A portion of the equivalent electric diagram has further been shown.

Transistors 2, or T1 and T2 in the equivalent electric diagram, comprise a common collector 4, or C, formed by a layer of P-type semiconductor material. Transistors 2 further comprise a common base 6, or B. Base 6 is formed by a layer of an N-type semiconductor material, for example, silicon, covering collector 4. Base 6 is covered with a layer 7 containing emitters 8, or E1 and E2.

Emitters 8, or E1 and E2, are located on top of and in contact with base 6. Each emitter 8 is formed by a region made of P-type semiconductor material, for example, silicon. Emitters 8 are separated from one another by insulator walls 12. In FIG. 1, four emitters 8 are shown.

An insulator layer 14 covers emitters 8 and walls 12. Vias 16 cross insulator layer 14 all the way to emitters 8, to couple them to elements, not shown. Vias 16 for example couple emitters 8 to metallization levels of an interconnection network. Vias 16 may also couple emitters 8 to phase-change material via resistive elements, to form memory cells of a phase-change memory controlled by bipolar transistors 2. The four transistors 2 then belong to a same word line of a memory.

Contacting regions 17 of base 6 are regularly distributed. These regions are made of N-type semiconductor material on top of and in contact with base 6 and separated from emitters 8 by insulating walls 12. Regions 17 are more heavily doped than base 6. Regions 17 are coupled by vias 18, similar to vias 16, and by an interconnection network, not shown, to an external connection terminal, not shown.

In the example of FIG. 1, a region 17 is formed every four emitters 8. In some embodiments, there may be fewer regions 17 as there are emitters 8. Since the surface area of each region 17 corresponds at least to the surface area of an emitter 8, decreasing the number of regions 17 enables to increase the number of transistors in a row of same length.

However, the semiconductor material of base 6, for example, silicon, has a relatively high resistance. There thus exist parasitic resistors, two of which are shown in the equivalent electric diagram and are designated with references R1 and R2, with a resistance which may for example be greater than 1 kΩ between two transistors or between a transistor and a region 17. Such a parasitic resistance is all the higher as the emitters and/or regions are distant.

It may be desirable, on the one hand, to have an identical parasitic resistance for all transistors 2, which may be obtained by forming one region 17 for each transistor, and on the other hand, to decrease the surface area for each transistor row, which may be obtained by forming a single region 17 per transistor row. A solution is to make a tradeoff by regularly forming regions 17 in each row.

However, the resistance between an emitter 8 and the closest region 17 is then not identical for all emitters 8. Further, the presence of regions 17 limits the number of emitters 8, and thus of memory cells, which may be formed on a row of a given length.

Further, during the manufacturing of certain components, such as certain memories, it is preferable to have a poly-silicon density which cannot be reached in the case of memories controlled by the bipolar transistors of FIG. 1.

Figure 2:
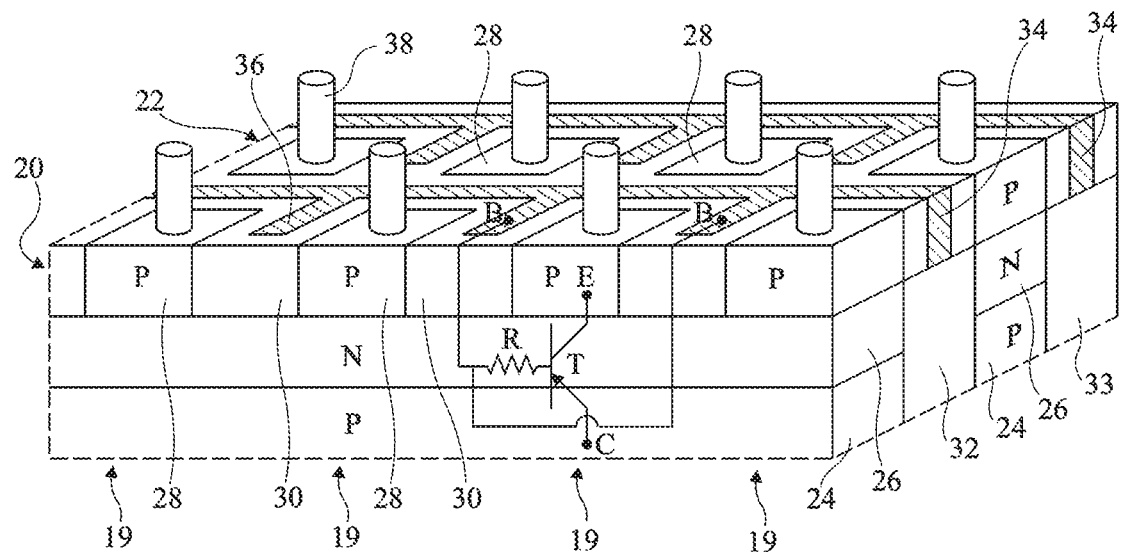
FIG. 2 is a simplified perspective view of an embodiment of bipolar transistors.

FIG. 2 is a simplified perspective view of an embodiment of bipolar transistors 19. A portion of the equivalent electric diagram showing a transistors T and its connections has also been shown.

Figure 3:
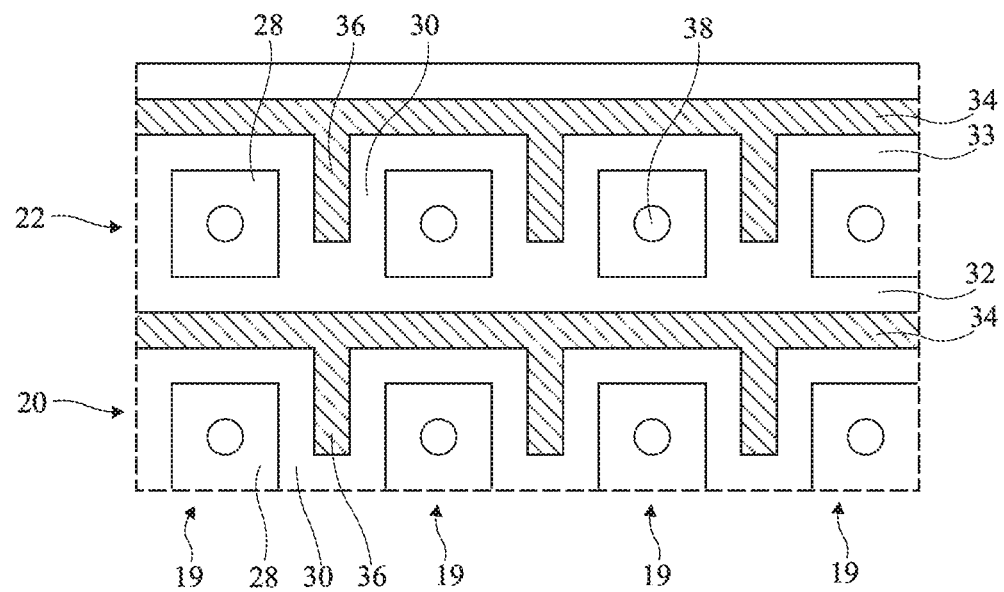
FIG. 3 is a simplified top view of the embodiment of FIG. 2.

FIG. 3 is a top view of the embodiment of FIG. 2.

FIGS. 2 and 3 show an array of eight bipolar transistors, separated in two rows 20 and 22, each comprising four transistors. Each bipolar transistor 19 controls, for example, a memory cell of a phase-change memory. Rows 20 and 22 then control word lines of the phase-change memory, and the columns of the array control bit lines of the memory. Each transistor comprises a base (B) and two semiconductor regions forming the conduction terminals, emitter (E) and collector (C).

As illustrated in FIG. 2, each row 20 or 22 of transistors 19 comprises a region 24 forming a collector, common to the entire row in the present example. Region 24 is formed by a layer of semiconductor material, for example, of type P. Each region 24 of a row 20 or 22 is covered with a base 26 common to the transistors of this row, formed by a layer of semiconductor material, for example, of type N.

Regions 28 made of semiconductor material, forming emitters and shown in FIGS. 2 and 3, are formed on top of an in contact with base 26. Each transistor 19 further comprises a via 38 crossing an insulator layer, not shown, covering emitters 28. Vias 38 for example enable to connect the transistors to resistive elements, not shown, of a phase-change memory or to an interconnection network.

The rows of bipolar transistors 19 are separated from one another by insulating trenches 32 and 33, for example, made of a usual oxide for insulating or STI ("Shallow Trench Isolation") trenches, for example, made of silicon oxide, extending in a first direction and being sufficiently deep to insulate the transistors 19 of different rows from one another without for all this thoroughly crossing the substrate. FIGS. 2 and 3 show two insulating trenches 32 and 33, trench 32 separating rows 20 and 22 and trench 33 separating row 22 from a row, not shown. It is here considered that each insulating trench is associated with a row of bipolar transistors parallel to and in contact with the trench. Trench 32 is here associated with row 20 and trench 33 is here associated with row 22.

A main conductive bar 34 extends opposite each of insulating trenches 32 and 33. Each main conductive bar 34 is for example sufficiently long to face all the emitters of the row of transistors associated with the corresponding trench. Auxiliary conductive bars 36 extend from each main conductive bar 34 between the emitters 28 of a same transistor row. More specifically, auxiliary bars 36 extend along a portion of the length of emitters 28. Conductive bars 36 extend in a second direction, orthogonal to the first direction. Each emitter 28 of a given row is thus separated from each neighboring emitter by an auxiliary conductive bar 36. Auxiliary conductive bars 36 come into contact with the common base 26 and are interconnected by main conductive bar 34 to form a comb. According to an embodiment, main conductive bars 34 and auxiliary conductive bars 36 are made of polysilicon. According to an embodiment, a metal layer, not shown, is interposed between each conductive bar and base 26 to improve the electric contact. The metal layer is for example made of titanium. The metal layer for example has a thickness in the range from 1 to 20 nm. According to another embodiment, the conductive bars are totally made of metal.

Conductive bars 34 and 36 are separated from regions 28 and from the conductive bars 34 and 36 of other rows by insulating walls 30, for example, made of silicon oxide. The insulating walls particularly comprise insulating spacers.

Each main conductive bar 34 may be coupled to an external connection terminal, not shown, by one or a plurality of connections, preferably a single connection for each main conductive bar 34. Each connection is made by neutralizing a transistor location, that is, although a transistor is formed at this location, it is connected to nothing. A via is then formed at each of these locations to couple the conductive bar to an outer connection terminal via the interconnection network.

Each emitter 28 is separated from an auxiliary conductive bar 36, that is from an area of contact with the base, by a portion of an insulating wall 30 having dimensions substantially equal to those of the portions of insulating walls located between other emitters and auxiliary conductive bars. The parasitic resistor, designated with reference R in the equivalent electric diagram and formed in the base, thus has a resistance identical for all bipolar transistors 19 and smaller than in the example of FIG. 1. Main conductive bars 34 and auxiliary conductive bars 36 being made of polysilicon, they form parasitic resistors with a smaller resistance than those formed in the base between emitters 8 of FIG. 1, for example, from 10 to 100 times smaller.

The distance separating the emitters depends on the bipolar transistor manufacturing method. With current technologies, the minimum distance which may be manufactured is approximately 100 nm.

For the voltage values used in memories, for example, a 4-V maximum, it is considered that the minimum silicon oxide thickness for a correct insulation between two conductive elements, that is, for example, emitters 28 and conductive bars 34 and 36, is approximately 10 nm.

It is thus possible to form conductive bars 34 and 36, having a width for example in the range from 25 to 40 nm, between the portions of insulating wall 30, having a thickness greater than 10 nm. The insulating wall portions provide an insulation considered as correct between emitters 28 and conductive bars 34 and 36.

More generally, the width of conductive bars 34 and 36 is selected according to the width of insulator walls 30 and of the voltage that they will have to be able to insulate.

FIGS. 4, 5A, 5B, 6A to 6C and 7A to 7C illustrate a method of manufacturing the structure shown in FIG. 2.

Figure 4:
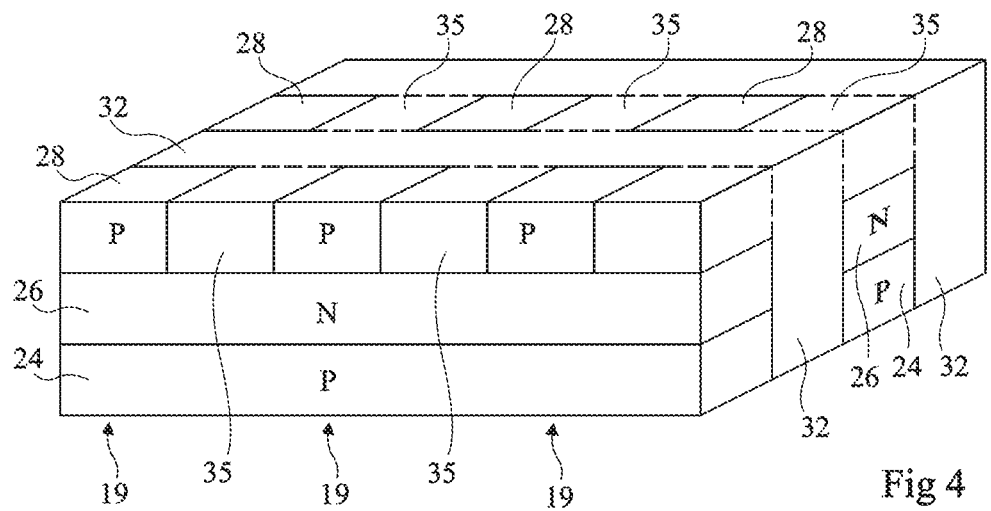
FIG. 4 is a perspective view showing a manufacturing step of the embodiment of FIGS. 2 and 3.

FIG. 4 illustrates a step during which transistors 19, that is, the collectors, bases, and emitters, are first formed in a substrate. This step comprises the forming and the doping of the layers forming collectors 24, bases 26, and emitters 28, the forming of trenches 32 separating the transistor rows, and the forming of insulator walls 35 separating emitters 28. These steps are for example carried out by usual manufacturing processes. The transistors are for example formed to be as close as possible for existing technologies. The distance between two emitters is for example in the range from 80 to 150 nm.

Figure 5A:
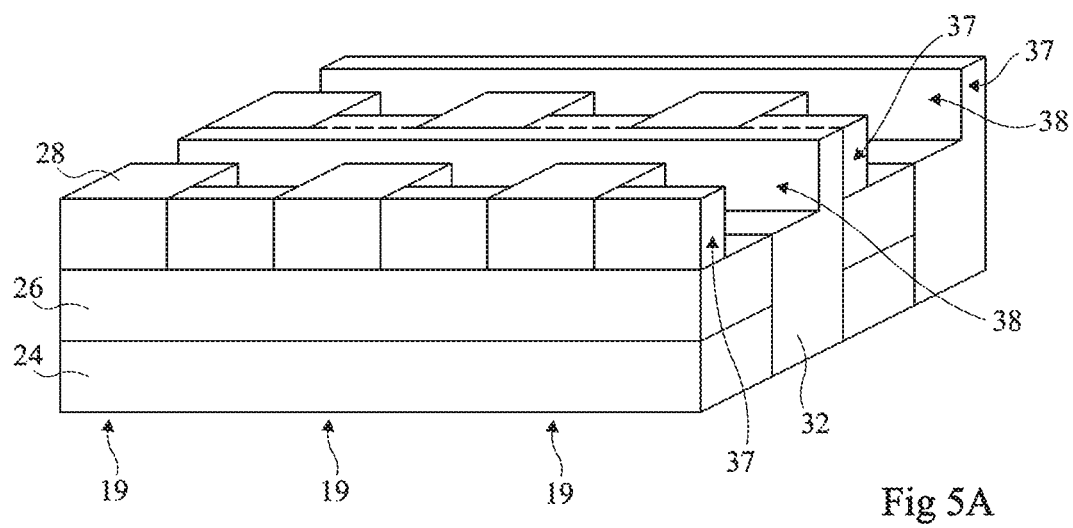
FIGS. 5A and 5B are a perspective view and a top view, respectively, showing another manufacturing step of the embodiment of FIGS. 2 and 3.
Figure 5B:
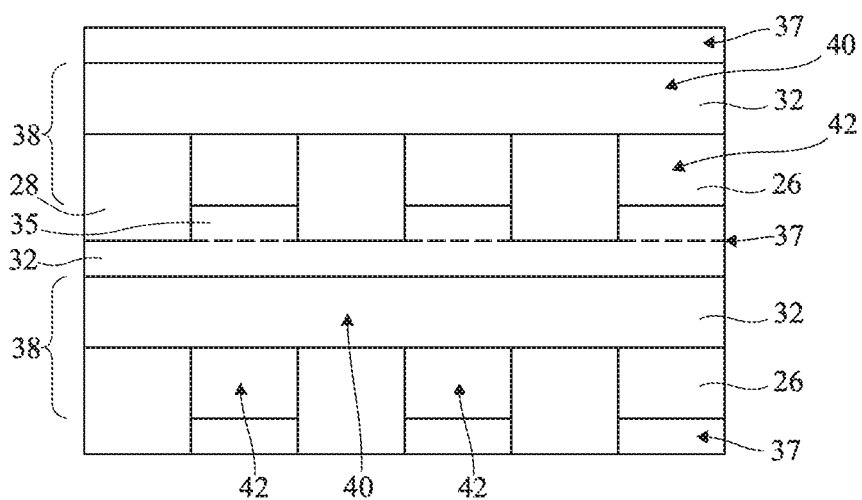

FIGS. 5A and 5B are a perspective view and a top view showing another manufacturing step of the embodiment of FIGS. 2 and 3.

During this step, an etch mask, not shown, is formed. The etch mask comprises one strip for each transistor row, each strip partially covering emitters 28, partially covering the neighboring trench 32, and partially covering the neighboring walls 35. A selective etching is then carried out to remove the insulator of trenches 32 and of walls 35 from the non-protected areas. The etching is performed until layer 26 is exposed. The mask is then removed.

There thus remain strips 37 of insulating material partly extending between the emitters of a same row and partially extending along these emitters.

Cavities 38 are thus formed. Cavities 38 are substantially comb-shaped, that is, they comprise a main cavity 40 extending along the emitters 28 of a same row and auxiliary cavities 42 each extending between two neighboring emitters 28 of a same row.

Figure 6A:
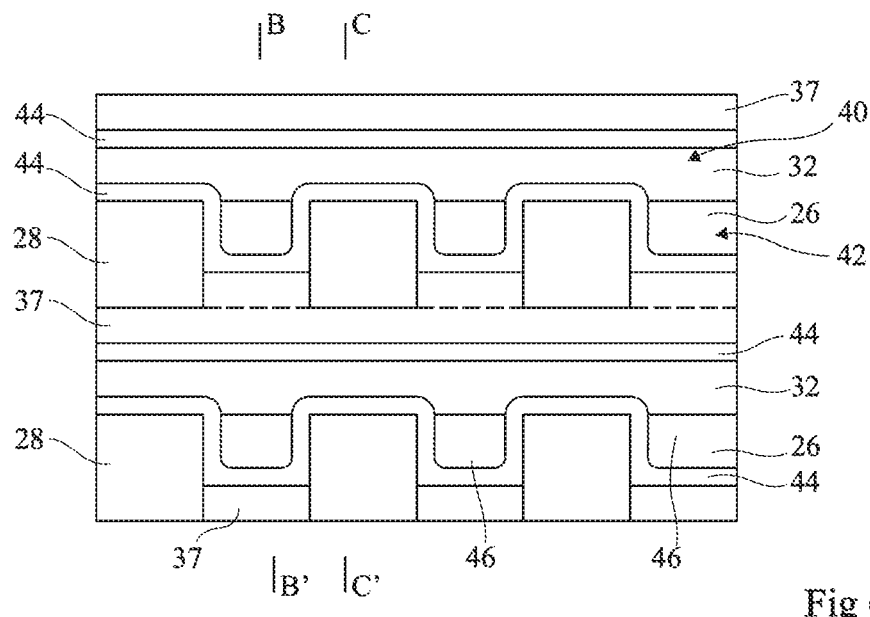
FIG. 6A is a top view showing another manufacturing step of the embodiment of FIGS. 2 and 3.
Figure 6B:
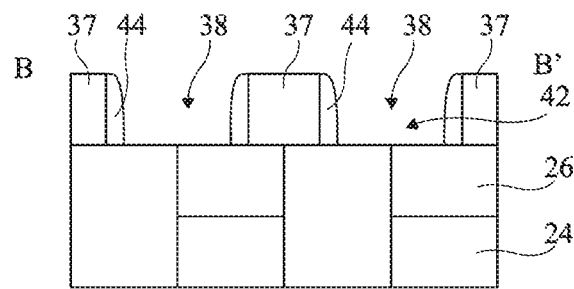
FIGS. 6B and 6C are cross-section views along planes B-B' and C-C', respectively, of FIG. 6A showing another manufacturing step of the embodiment of FIGS. 2 and 3.
Figure 6C:
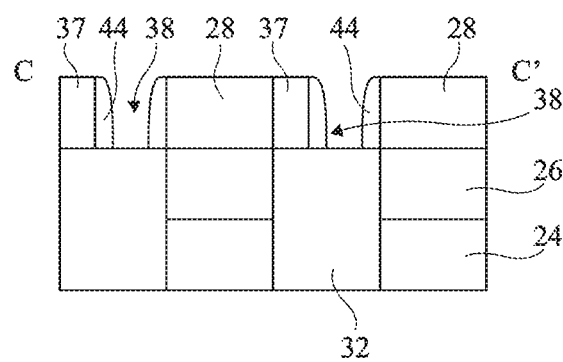

FIGS. 6A to 6C are a top view and cross-section views along planes B-B' and C-C' of FIG. 6A showing another manufacturing step of the embodiment.

During this step, spacers 44 are formed on the walls of cavities 38. Spacers 44 are for example made of silicon oxide.

The dimensions of spacers 44 are sufficiently small for the exposed portions 46 of base 26 of auxiliary cavities 42 not to be totally covered with the spacers. The portions 46 of base 26 are thus always at least partially exposed between the emitters of a same transistor row. Further, main cavities 40 are not totally filled. The cavities 42 of a same transistor row are thus connected to the corresponding cavity 40.

Figure 7A:
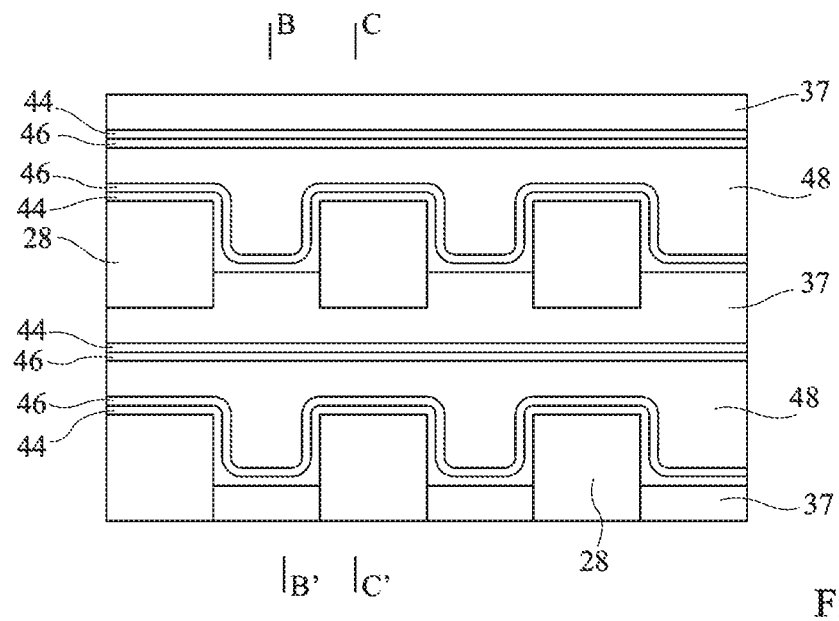
FIG. 7A is a top view showing another manufacturing step of the embodiment of FIGS. 2 and 3.
Figure 7B:
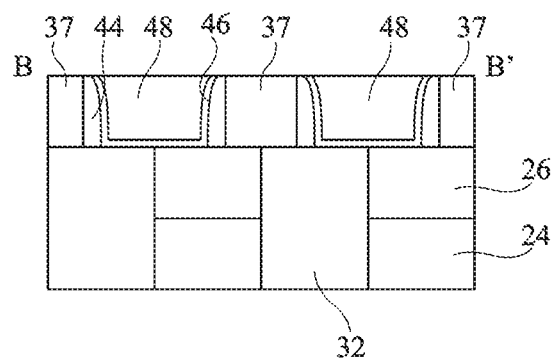
FIGS. 7B and 7C are cross-section views along planes B-B' and C-C', respectively, of FIG. 7A showing another manufacturing step of the embodiment of FIGS. 2 and 3.
Figure 7C:
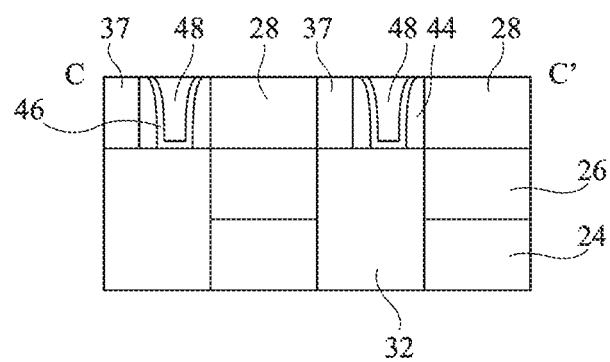

FIGS. 7A to 7C are a top view and cross-section views along planes B-B' and C-C' of FIG. 7A showing another manufacturing step of an embodiment.

During this step, a metal layer 46, for example, titanium, is deposited on the bottom of cavity 38 and on spacers 44. Cavities 38 are then filled with polysilicon 48 to form main bars 34 in regions 40 and auxiliary bars 36 in regions 42.

As a variation, metal layer 46 may be omitted.

As a variation, the polysilicon may be replaced with a metal.

It could have been devised to directly etch trenches having the shape of the comb of semiconductor material in walls 35 and trenches 32, however, such an etching, with current methods, is inaccurate, particularly at the angles. Thus, the etching might reach emitters 28 and create contacts and thus direct electric connections between the emitters and conductive bars 34 and 36 (the base).

The forming of spacers 44 after the etch step has the advantage of ensuring the presence of insulating material between the emitters and conductive bars 34 and 36.

According to an embodiment, to increase the polysilicon density, polysilicon strips covering insulator strips may be formed on the layer comprising the emitters. Such strips may for example extend in the direction orthogonal to the direction of the transistor rows (second direction), on at least some of auxiliary bars 36. The strips may be formed during the forming of the insulators and of the gate conductors of MOS transistors.

As a variation, for other applications where certain transistors are integrally in parallel, a main conductive bar 34, located in an insulating trench separating transistor rows, may interconnect auxiliary conductive bars 36 located between emitters of two transistor rows.

An advantage of the described embodiments is that the parasitic resistors between the base contacting areas and the different emitters have a resistance smaller than in usual implementations and substantially identical for all transistors.

Another advantage of the described embodiments is that the interconnection of the contacting areas with the base, that is, auxiliary conductive bars 36, is not performed through the interconnection network. It is thus not necessary to provide the space sufficient for a metallization between the lower level metallizations of the interconnection network coupled to two neighboring emitters. Thus, the distance between two emitters only depends on the resolution of the masks used on manufacturing, on the thickness of insulator enabling to correctly insulate the provided voltages, and on the thickness of the conductive bars.

Another advantage of the described embodiments is an increase in the density of transistors and thus of memory cells. In the case where each word line comprises a single connection to the interconnection network, the length of a row such as that described in relation with FIGS. 2 and 3 is decreased by approximately 35% as compared with a structure of the type in FIG. 1 having the same number of transistors.

Specific embodiments have been described. Various alterations, modifications, and improvements will occur to those skilled in the art. In particular, the bipolar transistors described in relation with the drawings are PNP bipolar transistors. They may however be NPN bipolar transistors.

Further, the transistors described in the present disclosure have been described in the context of transistors controlling memory cells, and more particularly phase-change memory cells. However, the described embodiments may also be implemented for rows of transistors having a common base used in other fields.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present disclosure. Accordingly, the foregoing description is by way of example only and is not intended to be limiting. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   a row of bipolar transistors arranged along a first direction, including:
      a plurality of first conduction regions;
      a second conduction region;
      a common base between the first conduction regions and the second conduction region;
      an insulating trench in contact with each bipolar transistor of the row of bipolar transistors;
      a conductive layer on the insulating trench and on the common base between the first conduction regions, the conductive layer having a comb shape with a first portion extending along the first direction on the insulating trench and a plurality of second portions extending between adjacent ones of the first conduction regions along a second direction that is transverse to the first direction; and
   a spacer layer between the conductive layer and the first conduction regions.

2. The integrated circuit of claim 1, wherein the conductive layer includes polysilicon.

3. The integrated circuit of claim 2, further comprising a metal layer between the conductive layer and the common base.

4. The integrated circuit of claim 1, wherein the conductive layer includes a metal.

5. The integrated circuit of claim 4, wherein the metal is titanium.

6. The integrated circuit of claim 1, wherein each bipolar transistor of the row of bipolar transistor, in use, controls a respective memory cell of a phase-change memory.

7. The integrated circuit of claim 1, wherein the conductive layer is connected by a single via to an interconnection network.

8. The integrated circuit of claim 1, wherein the plurality of first conduction regions contacts the base, and the base contacts the second conduction region.

9. The integrated circuit of claim 1, wherein each of the bipolar transistors of the row of bipolar transistors includes the second conduction region.

10. The integrated circuit of claim 1, wherein at least portions of the conductive layer are covered with insulating strips and with polysilicon strips.

11. A device, comprising:
    a first row of transistors arranged along a first direction, the first row of transistors including:
       a first conduction region having a first dopant type;
       a common base on the first conduction region, the common base having a second dopant type opposite the first dopant type;
       a plurality of second conduction regions on the common base, the plurality of second conduction regions having the first dopant type, each of the transistors of the first row including a respective second conduction region; and
       a first insulating trench extending along the first direction and in contact with each transistor of the first row of transistors;
    a conductive layer on the first insulating trench and the common base, the conductive layer having a first portion extending along the first direction and a plurality of second portions extending from the first portion along a second direction that is transverse to the first direction, each of the plurality of second portions of the conductive layer extending between adjacent ones of the second conduction regions; and
    a spacer layer between the conductive layer and the second conduction regions.

12. The device of claim 11, further comprising a metal layer between the conductive layer and the common base, wherein the conductive layer includes polysilicon.

13. The device of claim 11, further comprising:
    a second row of transistors arranged along the first direction, the second row of transistors being spaced apart from the first row of transistors by the insulating trench.

14. The device of claim 13, further comprising:
    a second insulating trench extending along the first direction and in contact with each transistor of the second row of transistors, the second row of transistors being between the first insulating trench and the second insulating trench.

15. A device, comprising:
a plurality of bipolar transistors arranged along a first direction, the plurality of bipolar transistors including:
   a plurality of first conduction regions having a first conductivity type;
   a second conduction region having the first conductivity type;
   a common base between the first conduction regions and the second conduction region, the common base having a second conductivity type that is different from the first conductivity type, the second conduction region and the common base extending continuously under each of the first conduction regions;
an insulating trench in contact with each of the plurality of bipolar transistors;
a conductive layer having a comb shape with a first portion extending along the first direction on the insulating trench and a plurality of second portions extending between adjacent ones of the first conduction regions along a second direction that is transverse to the first direction; and
a spacer layer between the conductive layer and the first conduction regions.

16. The device of claim 15, further comprising a metal layer between the conductive layer and the common base.

17. The device of claim 15, wherein each bipolar transistor of the plurality of bipolar transistors, in use, controls a respective memory cell of a phase-change memory.

18. The device of claim 15, wherein the conductive layer is connected by a single via to an interconnection network.

19. The device of claim 15, wherein the plurality of first conduction regions contacts the base, and the base contacts the second conduction region.

20. The device of claim 15, wherein the conductive layer is at least partially covered with insulating strips and with polysilicon strips.

* * * * *